United States Patent
Yang et al.

(10) Patent No.: US 7,972,969 B2
(45) Date of Patent: Jul. 5, 2011

(54) METHOD AND APPARATUS FOR THINNING A SUBSTRATE

(75) Inventors: Ku-Feng Yang, Dali (TW); Wen-Chih Chiou, Toufen (TW); Weng-Jin Wu, Hsinchu (TW); Kewei Zuo, Yonghe (TW)

(73) Assignee: Taiwan Semiconductor Manufacturing Co., Ltd., Hsin-Chu (JP)

( * ) Notice: Subject to any disclaimer, the term of this patent is extended or adjusted under 35 U.S.C. 154(b) by 548 days.

(21) Appl. No.: 12/043,714

(22) Filed: Mar. 6, 2008

(65) Prior Publication Data

US 2009/0227047 A1    Sep. 10, 2009

(51) Int. Cl.
*H01L 21/302* (2006.01)
*H01L 21/461* (2006.01)

(52) U.S. Cl. ............. 438/748; 438/8; 438/459; 438/695

(58) Field of Classification Search .............. 438/8, 459, 438/748, 695
See application file for complete search history.

(56) References Cited

U.S. PATENT DOCUMENTS

| | | | |
|---|---|---|---|
| 5,089,305 A | 2/1992 | Ushijima et al. | |
| 5,268,065 A * | 12/1993 | Grupen-Shemansky | 438/118 |
| 5,399,229 A * | 3/1995 | Stefani et al. | 438/7 |
| 5,748,296 A * | 5/1998 | Canteloup | 356/72 |
| 6,149,759 A | 11/2000 | Guggenberger | |
| 6,383,331 B1 | 5/2002 | Sumnitsch | |
| 6,494,221 B1 | 12/2002 | Sellmer et al. | |
| 6,589,855 B2 | 7/2003 | Miyamoto et al. | |
| 2002/0153030 A1 | 10/2002 | Chooi et al. | |
| 2004/0004724 A1 | 1/2004 | Kim et al. | |
| 2007/0175500 A1 | 8/2007 | Hohenwarter | |
| 2008/0315349 A1* | 12/2008 | Takei et al. | 257/506 |

FOREIGN PATENT DOCUMENTS

CN    1452018 A    10/2003

OTHER PUBLICATIONS

Official Action issued on Jul. 19, 2010 in counterpart Chinese application.

* cited by examiner

*Primary Examiner* — Matthew C Landau
*Assistant Examiner* — Sonya D McCall Shepard
(74) *Attorney, Agent, or Firm* — Duane Morris LLP; Steven E. Koffs

(57) ABSTRACT

A method is provided for controlling substrate thickness. At least one etchant is dispensed from at least one dispenser to a plurality of different locations on a surface of a spinning substrate to perform etching. A thickness of the spinning substrate is monitored at the plurality of locations, so that the thickness of the substrate is monitored at each individual location while dispensing the etchant at that location. A respective amount of etching performed at each individual location is controlled, based on the respective monitored thickness at that location.

13 Claims, 10 Drawing Sheets

METHOD AND APPARATUS FOR THINNING A SUBSTRATE

FIELD OF THE INVENTION

The present invention relates to semiconductor fabrication methods and apparatus.

BACKGROUND

The semiconductor industry has been driven to reduce the size of integrated circuits (ICs) for many years. Three dimensional ICs (3D-IC) with ultra-thin wafers stack have been studied extensively. To support 3D-IC packaging, it is desirable not only to reduce the footprint of the IC, but also to reduce the thickness of the chip. Thinner chips may allow the use of 3D-IC for products in which a thin package is desired, such as mobile handheld communications devices (e.g., cellular phones and PDA's). A frequent method of achieving thin chips is to remove material from the back surface of the semiconductor wafer by chemical and/or mechanical means before singulation.

In a conventional wafer thinning process, mechanical grinding removes most of the silicon. Then, chemical-mechanical polishing (CMP) or wet etching releases the grinding stress to provide an ultra-thin wafer. But as the final thickness of the wafer shrinks, damage caused by mechanical grinding/CMP becomes a bigger concern and the impact of the grinding stress is unpredictable.

For the above reasons, wet etching has gradually become the dominant approach in the wafer thinning process. Some chip manufacturers have focused on silicon-on-insulator (SOI) wafers, and use a process in which wet etching stops on the buried oxide layer to achieve a desired thickness and uniformity.

Other manufacturers, focus on a bulk Si wafer approach, using wet etching. However, the bulk Si approach does not have the etch stop layer used in SOI processes, and may result in a non-uniform substrate thickness.

Currently, both Semitools and SEZ AG of Villach, Austria provide wet etching solutions for wafer thinning. Semitool's wet batch wafer thinning controls the amount of etching by time, but does not provide thickness uniformity control, so the uniformity of wafer gets worse as Si removal increases. SEZ provides etch control by spectrometer analysis of the process effluent to detect a chemical inlet shift. The shift at the chemical inlet indicates that the material being etched has changed, which is a sign that the etchant has removed an overlying layer, and has begun to etch an underlying layer.

An method for providing uniform thickness across a wafer is desired.

SUMMARY OF THE INVENTION

In some embodiments, a method for controlling substrate thickness includes dispensing at least one etchant from at least one dispenser to a plurality of different locations on a surface of a spinning substrate to perform etching thickness of the spinning substrate is monitored at the plurality of locations, so that the thickness of the substrate is monitored at each individual location while dispensing the etchant at that location. A respective amount of etching performed at each individual location is controlled, based on the respective monitored thickness at that location.

In some embodiments, a method controls thickness of a semiconductor substrate having a front surface and a back surface. A semiconductor substrate is spun in a spin processor. A dispenser is moved while dispensing an etchant from the dispenser to a plurality of different locations on the back surface of the spinning substrate. A thickness of the spinning substrate is monitored at the plurality of locations, so that the thickness of the substrate is monitored at each individual location while dispensing the etchant at that location. A respective amount of time during which etchant is dispensed at each individual location is dynamically controlled, based on the respective monitored thickness at that location, so that a standard deviation of the thickness is maintained at or below a predetermined value across the substrate.

In some embodiments, an apparatus is provided for processing a substrate. A movable dispenser is provided for dispensing an etchant on a surface of a spinning substrate at a plurality of different locations. At least one sensor is provided for monitoring a thickness of the spinning substrate, so that the thickness of the substrate is monitored at each individual location while dispensing the etchant at that location. A controller is provided for controlling a respective amount of etchant dispensed at each individual location, based on the respective monitored thickness at that location.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Methods are described below for in situ, dynamic control of wafer thinning, to provide improved uniformity. Closed-loop uniformity control is enabled using a spinning wet etching approach.

Figure 4:
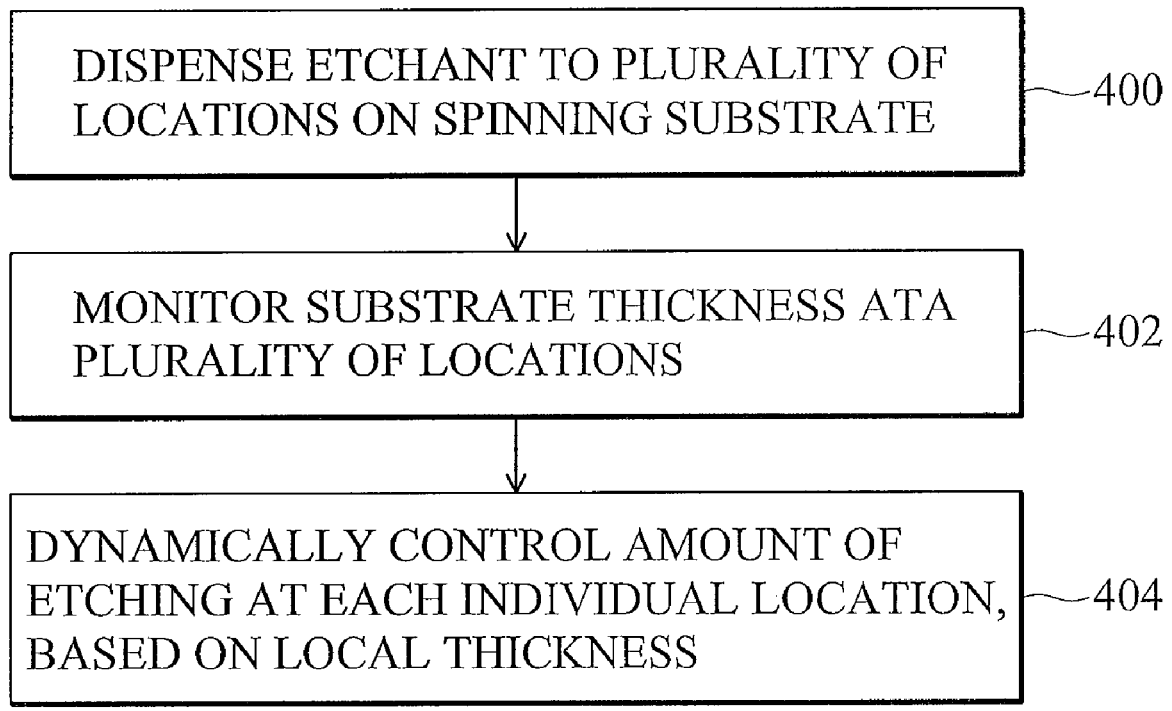
FIG. 4 is a flow chart of an exemplary method for controlling wafer thickness.

FIG. 4 is a flow chart of an exemplary method for controlling substrate thickness.

At step 400, at least one etchant is dispensed from at least one dispenser to a plurality of different locations on a surface of a spinning substrate to perform etching.

At step 402, a thickness of the spinning substrate is monitored at the plurality of locations, so that the thickness of the substrate is monitored at each individual location while dispensing the etchant at that location.

At step 404, a respective amount of etching performed at each individual location is controlled, based on the respective in-situ monitored thickness at that location.

Preferably, the amount of time during which etchant is dispensed to each location is controlled so that the thickness is substantially uniform across the substrate.

By dynamically controlling the local thickness of the substrate based on in situ monitoring of local thickness, the uniformity of the substrate thickness can be controlled to a desired accuracy. A variety of techniques may be used to perform the monitoring and dispensing. A few examples are provided below.

Figure 1:
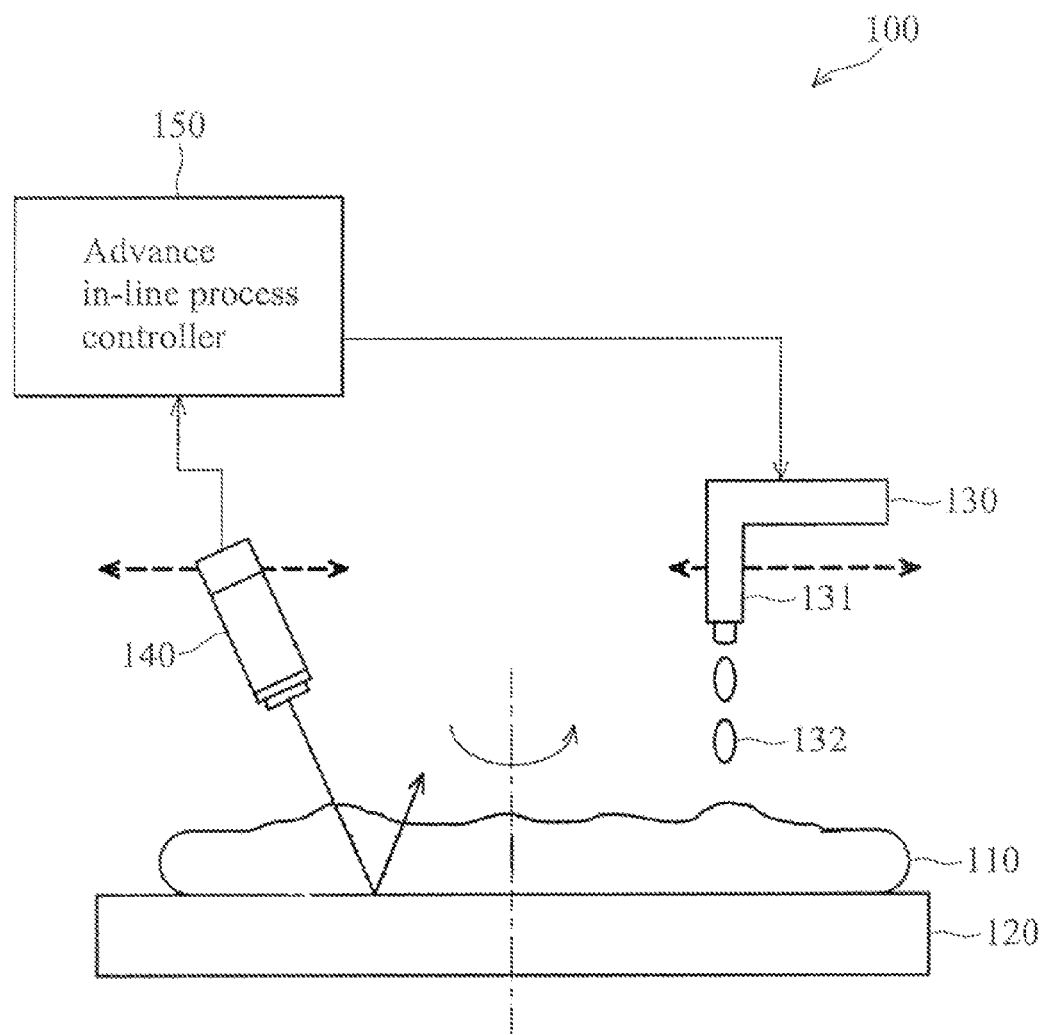
FIG. 1 is a schematic diagram of a method and system using at least one movable etchant dispenser, at least one monitoring sensor, and a controller.
Figure 5:
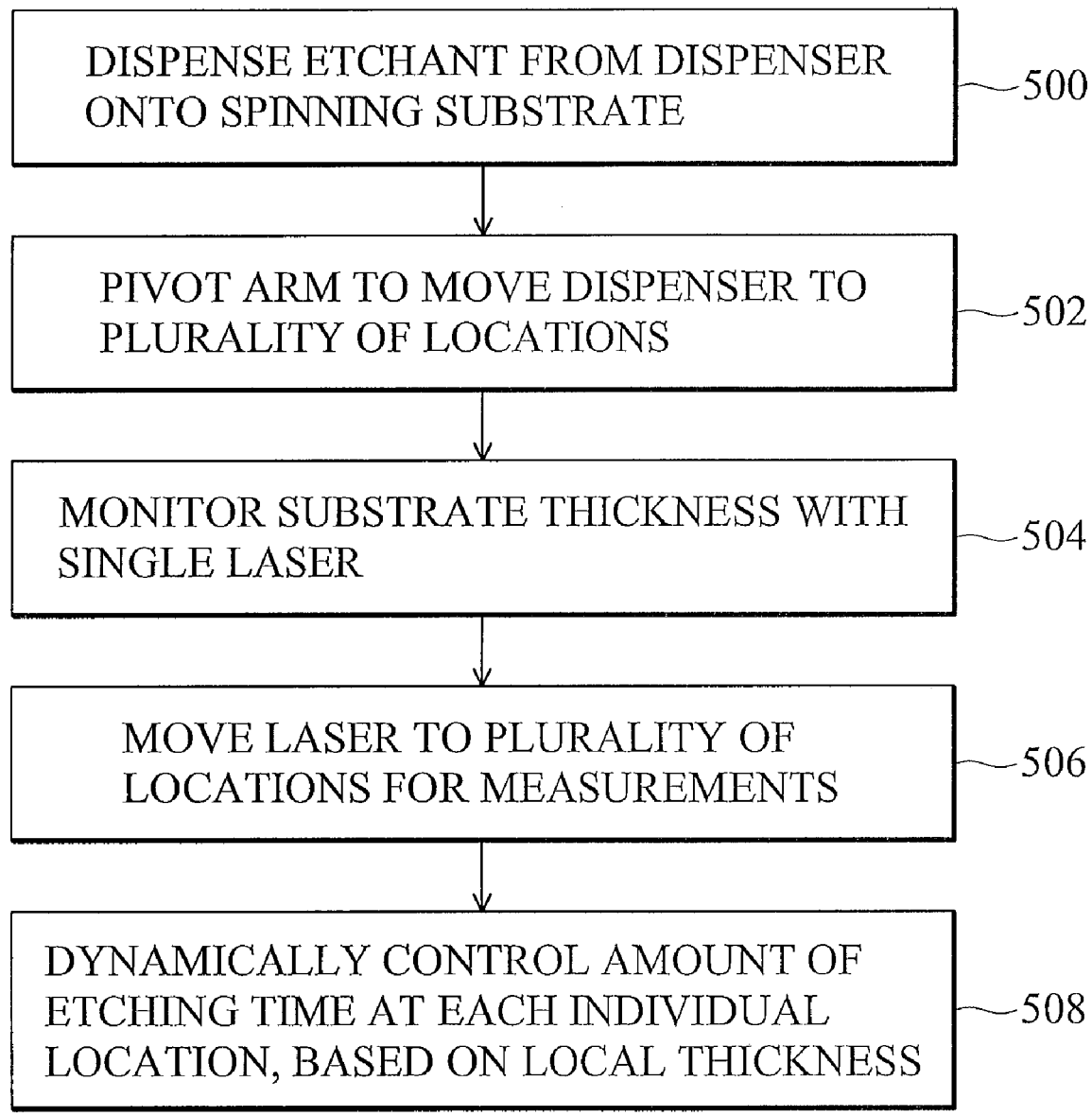
FIG. 5 is a flow chart of an exemplary method for controlling wafer thickness using the apparatus of FIG. 1.

FIG. 1 is a schematic diagram of an exemplary apparatus 100 for controlling the thickness of the substrate. FIG. 5 is a flow chart of an exemplary method for controlling substrate thickness using the apparatus of FIG. 1.

The apparatus 100 may be included as a part of a spin processor, such as a modification to a type of spin processor marketed by SEZ AG of Austria. The spin processor is capable of supporting wafer thinning. Spin processors are disclosed in U.S. Pat. Nos. 5,089,305, 6,149,759, 6,383,331, and 6,589,855, and U.S. Patent Application Publication No. 2007/0175500, all of which are incorporated by reference herein in their entireties.

Preferably, the spin processor is suitable for a variety of additional applications, including Polymer Clean, Layer Etching, Layer Thinning & Etchback, Film Removal, Backside & Bevel Clean, Si Stress Relief, and Si Thinning, so that additional wafer fabrication operations can be performed in the same spin processor.

The spin processor includes a spin chuck 120, on which a semiconductor substrate 110, such as a silicon wafer, is placed. The spin chuck 120 holds and rotates the substrate 120. The spin chuck 120 may be connected to a motor unit 360 (shown in FIG. 3) to rotate the spin chuck about its axis. Referring again to FIG. 1, for the substrate thinning operation discussed below, the wafer 110 is positioned with its front face (including the contact pads) facing the spin chuck 120.

The spin processor has at least one nozzle 131, which may be positioned on a pivoting dispenser arm 130. The nozzle 131 dispenses fluids for fabrication processes. In the case of the wafer thinning operation, the nozzle dispenses etchant 132. The same nozzle 132 may also be used to dispense other fluids used in IC fabrication, such as photoresist, water, clean dry air, or the like. The dispenser may be similar to a type as disclosed in U.S. Pat. No. 5,089,305 or U.S. Pat. No. 6,383,331, but modified to include a stepper motor 360 (FIG. 3) for precisely controlling the motion of the dispenser. Further, the dispenser is not limited to the types described in the above mentioned patents, and those of ordinary skill can select or design other suitable dispensers. For example, in other embodiments, the dispenser may be moved along a straight line by a linear actuator (not shown).

A sensor (preferably a non-contact sensor, such as a commercially available scanning laser or infrared (IR) gauge) 140 is provided for in situ measurement of the local thickness of the substrate 110 during wafer thinning. For a Laser or IR gauge, induced incident light penetrates from air into the substrate (e.g., Si wafer), which has a different reflectance index from air. The sensor detects the interference time of reflected light from the interface at the air/Si and Si/air or Si/substrate interface, to determinate Si thickness. An example of a suitable sensor is the SemDex 310 sensor by Isis Sentronics of Mannheim, Germany, which permits semi-automatic topographic measurements of wafers (for e.g. mini bumps), and other objects, including wafers having diameters of up to 300 mm or 12". Another suitable laser scanning gage is the C8125-01 optical microgage sold by Hamamatsu Photonics, K.K., Hamamatsu City, Japan. These are only exemplary, and other optical sensors may be used. In some embodiments, a laser projects light onto the surface of the substrate 110 at an angle, and is reflected back onto a photocell array. In some embodiments, the laser pivots without translation, to measure the thickness at different locations on the wafer. In other embodiments, the laser or IR sensor is moved across the wafer (e.g., the scanning laser gauge may be attached to an arm that pivots across the wafer, or connected to a linear actuator).

An in-line process controller 150 receives the raw sensor data from the sensor 140. Depending on the type of signal provided by the sensor 140, the controller 150 may perform amplification, filtering and/or analog-to-digital conversion, and may transmit the data to a computer (not shown) for processing, display, and/or storage. The controller 150 compares the local thickness to a target thickness, and determines an amount of material to be removed at that location. The controller then provides control signals to the dispenser 130, causing the dispenser to dispense an appropriate amount of etchant to reduce the local thickness at that location to the target thickness.

Referring now to FIG. 5, at step 500, one etchant is dispensed from one dispenser 130 onto the back surface of the spinning substrate 110

At step 502, the arm of dispenser 130 is moved among the plurality of different locations, to perform etching at the plurality of different locations. In some embodiments, the dispenser moving step includes pivoting an arm having the dispenser thereon. The arm pivots about a pivot axis of the arm, and the dispenser is offset from the pivot axis of the arm.

At step 504, a thickness of the spinning substrate is monitored with a single sensor 140.

At step 506, the single sensor 140 is pivoted or moved among the plurality of locations, so that the thickness of the substrate is monitored at each individual location while dispensing the etchant at that location. In some embodiments, the sensor pivots precisely to a plurality of predetermined angles, for measuring thickness at a plurality of locations. For example, the pivoting of the sensor may be controlled using a stepper motor (not shown).

In other embodiments, the sensor 140 is attached directly or indirectly to the arm of the dispenser 130, so that the sensor 140 moves with the dispenser. Indirect attachment may include a linkage or other mechanical means.

In other embodiments, the sensor 140 is mounted independently of the dispenser 130, and the sensor is moved (either using a separate pivot arm or a linear actuator), and the movement of the sensor 140 is controlled separately by controller 150 or by a separate controller (not shown). In embodiments with a moving sensor, the sensor preferably moves in a plane parallel to a plane in which the surface of the spin chuck is located, simplifying the thickness determination.

At step 508, a respective amount of etching performed at each individual location is controlled, based on the respective in-situ monitored local thickness at that location. In some embodiments, the dispenser 130 dispenses a single etchant solution with a single predetermined concentration, and the amount of etching to be performed at any given location is controlled by setting the amount of time that the etchant is dispensed at that given location. The reduction in local thickness at a given location is proportional to the length of time that the etchant is dispensed at that location. An example of a suitable etchant for tunable etching is HNA, a combination of hydrofluoric Acid (HF), Nitric Acid (HNO3) and Acetic Acid (CH3COOH), for which etching rate is tunable from 1 μm/minute to 35 μm/minute by varying additives.

In some embodiments, the thickness at each individual location is monitored continually (at least while dispensing etchant to that individual location), and the dispensing of etchant at that location continues until the thickness reaches the target value. Termination of dispensing the etchant at each location is controlled dynamically based on the in situ measurements.

In other embodiments, the thickness at each individual location is measured, and an approximate dispensing time is calculated. The etchant is then dispensed for a predetermined fraction (e.g., 50%) of the calculated etching time, the local thickness is again measured, and a remaining etching time is calculated based on the current thickness. The cycle of etching, measuring and calculating is repeated, until the remaining thickness to be removed (or remaining time to dispense etchant) falls below a convergence criterion value. This variation should place a smaller load upon the controller and/or computer that are processing the received data and controlling operation of the apparatus 100.

In some embodiments, the dispensing step includes dispensing etchant for a first period of time at a first location on the surface at which the substrate has a first thickness, and dispensing etchant for a second period of time at a second location on the surface at which the substrate has a second thickness, wherein the first period of time is longer than the second period of time, and the first thickness is greater than the second thickness. Thus, using the in-situ feedback from thickness measurements, etchant is dispensed to different portions of the wafer for respectively different amounts of time.

In some embodiments, the amount of time during which etchant is dispensed to each location is controlled so that a standard deviation of the thickness is reduced to a predetermined value across the substrate. After the etchant has been dispensed at each of the plurality of locations, a measure of the uniformity of the thickness (e.g., the standard deviation of the sampled thickness values) is calculated, and a fine tuning pass may be performed be performing additional etching at one or more of the plurality of locations, to achieve the desired degree of uniformity.

In still other embodiments, the thickness at each individual location is measured, and a dispensing time at that location is calculated by the controller. The etchant is dispensed at that location for the calculated time. Thus, the apparatus can be used for open loop control at each individual location, while still providing greater uniformity by individually controlling the amount of etchant applied at each location based on an initial measurement at each location.

In some embodiments, a stepper motor is used to move the dispenser to a number of discrete locations, and the time at each location (between rotations of the stepper motor) is precisely controlled.

In other embodiments, the moving step includes moving the dispenser 130 at a first rate while the dispenser is dispensing etchant at a first location on the surface at which the substrate 110 has a first thickness, and moving the dispenser at a second rate while the dispenser is dispensing etchant at a second location on the surface, at which the substrate has a second thickness, wherein the first rate is less than the second rate, and the first thickness is greater than the second thickness. Thus, the dispenser can be moved continually with a rate that varies to deposit more etchant where the dispenser is moving slowly, and less etchant where the dispenser is moving quickly.

At step 510, the thinned wafer is singulated to separate the individual integrated circuit (IC) dies from one another. Any suitable singulation method may be used.

At step 512, the ICs are packaged. The thinned ICs may be packaged in any configuration, including wire bonding or flip chip, in single level or multi-level (3D-IC) packages. The thinned ICs are particularly suitable for 3D-IC applications, because of the combination of thin dimension and uniform die thickness. The ICs thinned by the above method can be packed in 3D-IC packages along with other IC's thinned by the same method, or along with other ICs that are not thinned by the same method, or along with a separate IC package within the 3D-IC package.

Figure 2:
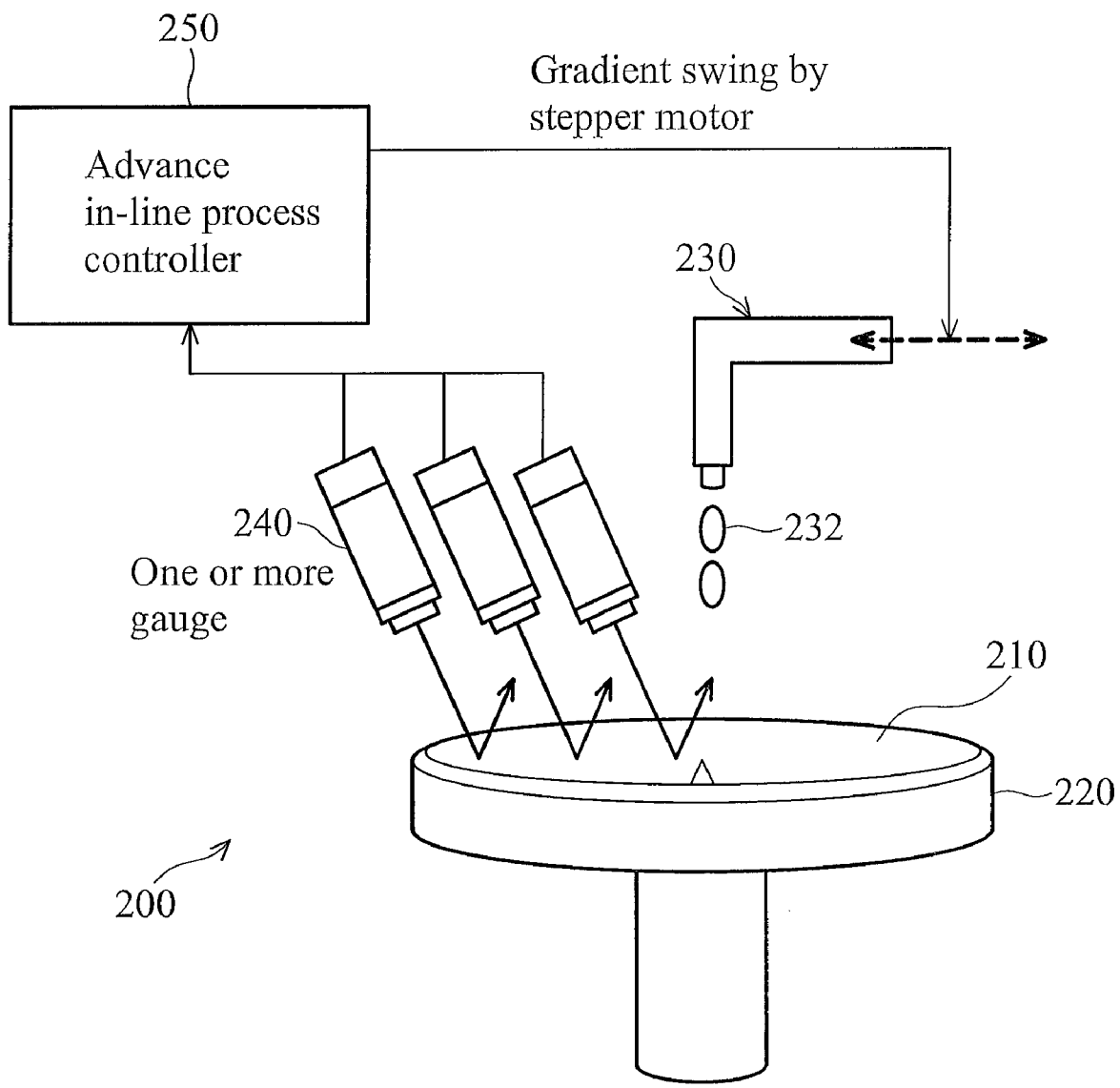
FIG. 2 is a schematic diagram of a method and system using at least one movable etchant dispenser, a plurality of monitoring sensors, and a controller.
Figure 6:
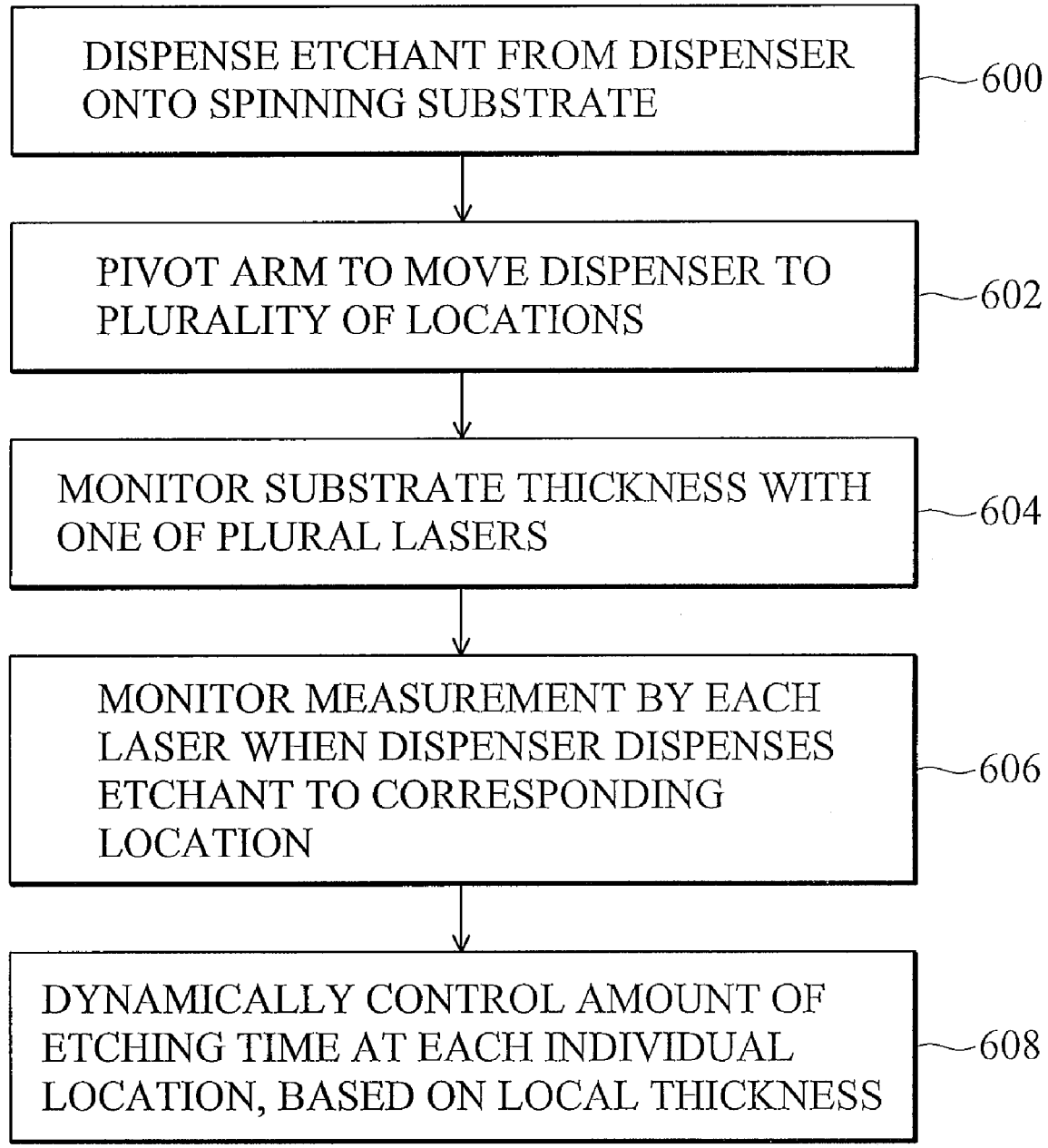
FIG. 6 is a flow chart of an exemplary method for controlling wafer thickness using the apparatus of FIG. 2.

FIGS. 2 and 6 show a method using a variation of the apparatus of FIG. 1. The apparatus 200 includes a configuration having a spin chuck 220, dispenser 230, and controller 250, similar to respective items 120, 130 and 150 described above. However, apparatus 200 includes a plurality of sensors 240 for measuring the thickness, which may include a plurality of laser point sources that are aimed to measure the thickness at a plurality of different locations having respectively different radial displacements along the wafer 210. The sensors may be located along a radius, or at various locations that are not on the same radius, but still have different radial displacements. Although FIG. 2 shows three sensors 240, the configuration may include two, four, or any desired number of sensors. One of ordinary skill in the art understands that as the number of sensors increases, the ability of the system to control thickness at individual locations also increases.

In some embodiments, the plurality of sensors 240 have fixed positions, which simplifies the hardware configuration and reduces costs. In other embodiments, one or more of the sensors 240 are pivotable or movable to provide more uniform thickness control across a range of locations in the wafer.

Referring now to FIG. 6, at step 600, at least one etchant 232 is dispensed from at least one dispenser 230 to a plurality of different locations on a surface of a spinning substrate 210 to perform etching.

At step 602, the arm of dispenser 230 is moved among the plurality of different locations, to perform etching at the plurality of different locations. In some embodiments, the dispenser moving step includes pivoting an arm about a pivot axis of the arm having the dispenser thereon, wherein the dispenser is offset from the pivot axis of the arm.

At step 604, a thickness of the spinning substrate is monitored with one of the sensors 240.

At step 606, the monitoring step includes sequentially monitoring the thickness of the substrate at each respective one of the plurality of locations using a respectively different sensor at each location. The thickness of the spinning substrate is monitored at each successive one of the plurality of locations, so that the thickness of the substrate is monitored at each individual location while dispensing the etchant at that location.

At step 608, a respective amount of etching performed at each individual location is controlled, based on the respective in-situ monitored thickness at that location.

The thinned wafer is singulated to provide ICs, which may be packaged in single layer or 3D-IC packages.

Figure 3:
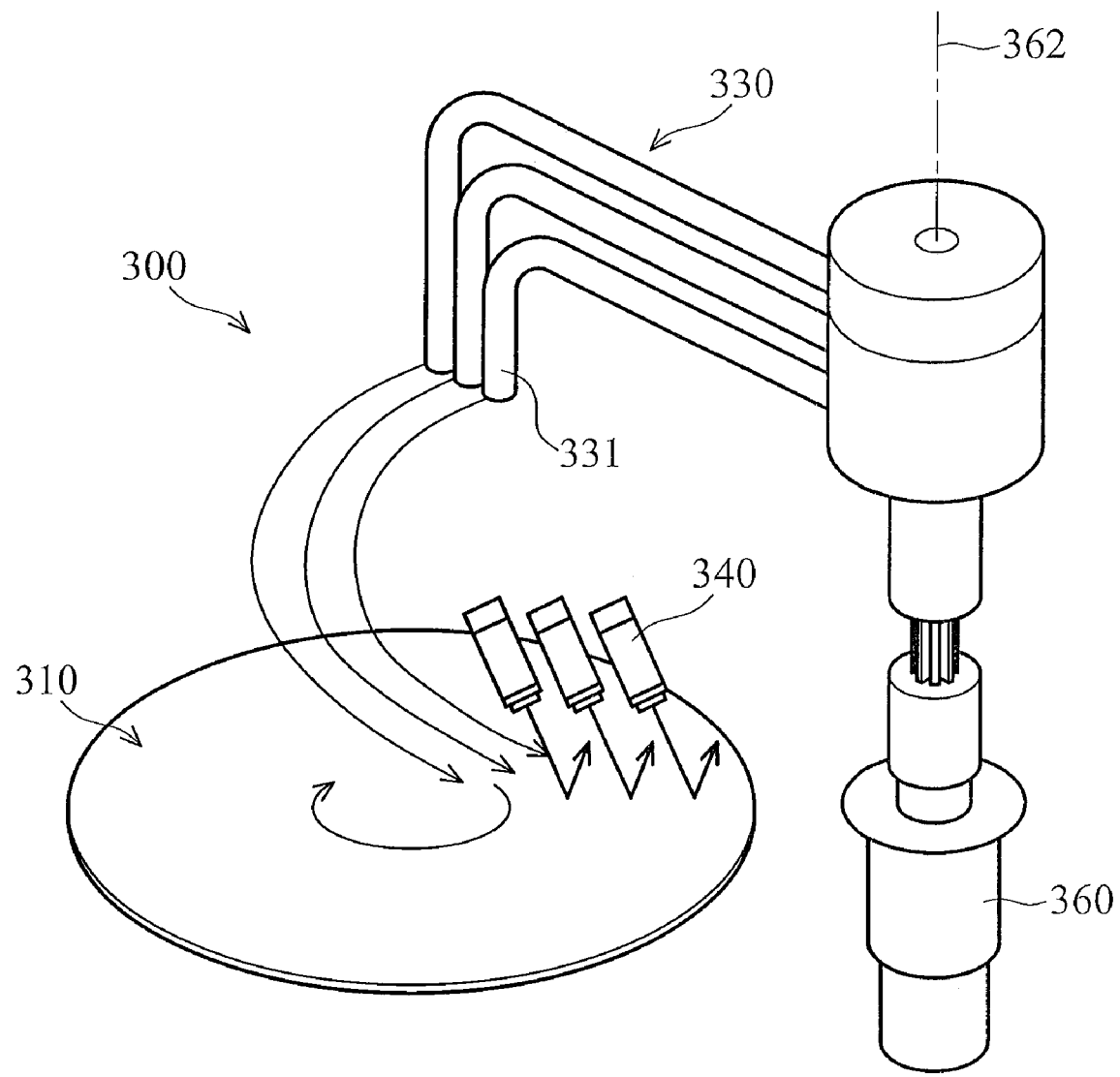
FIG. 3 is a schematic diagram of a method and system using at least one movable etchant dispenser with a plurality of nozzles, a plurality of monitoring sensors, and a controller.
Figure 7:
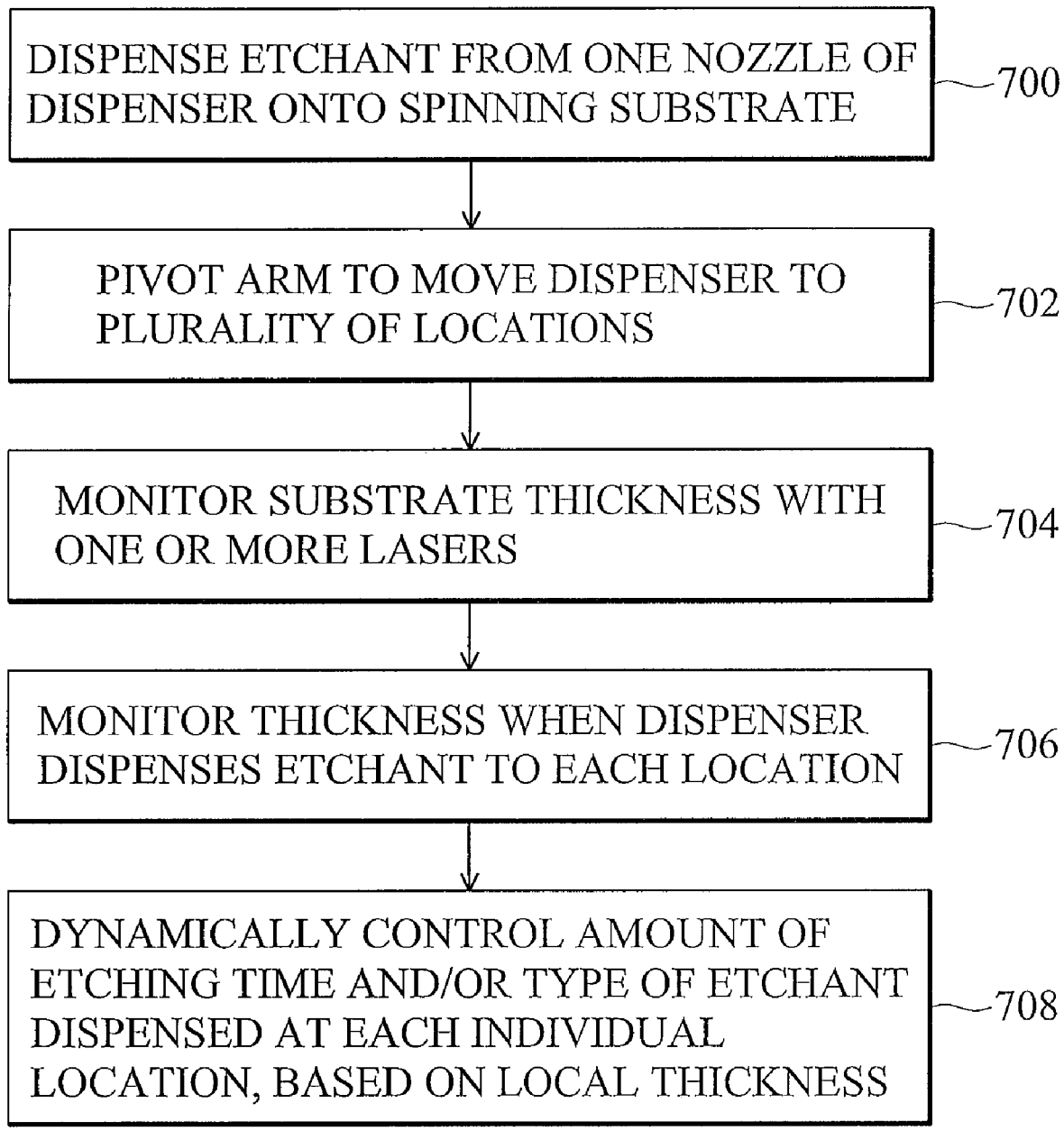
FIG. 7 is a flow chart of an exemplary method for controlling wafer thickness using the apparatus of FIG. 3.

FIGS. 3 and 7 show another variation of the method. In the apparatus 300 of FIG. 3, a dispenser 330 includes a plurality of nozzles 331. Each respective nozzle 331 may include a respectively different concentration of a single type of etchant, or each nozzle 331 may include a respectively different type of etchant. The dispenser apparatus may be of a type disclosed in U.S. Pat. No. 6,383,331, or of another type capable of dispensing multiple fluids from multiple sources. Although FIG. 3 shows three nozzles 331, the dispenser 330 may include two, four, or more than four nozzles.

FIG. 3 also shows the pivoting mechanism in greater detail. The pivoting means of FIG. 3 includes a rotating arm 330 that pivots about an axis 362. The pivoting may be controlled with a stepper motor 360.

FIG. 7 is a flow chart of a method that can be performed using the apparatus of FIG. 3. One of ordinary skill in the art will recognize that the apparatus 300 of FIG. 3 can also be used to perform any of the methods of FIGS. 4-6.

At step 700, the dispenser 330 dispenses etchant from one of the nozzles 331 of the dispenser onto the spinning substrate 310.

At step 702, the arm of dispenser 330 is pivoted to move the dispenser nozzles 331 to a plurality of locations. One of ordinary skill in the art can recognize that any of the nozzles 331 in FIG. 3 can be positioned at any given radius, so that any of the nozzles may be used to dispense etchant to any given location on the substrate 310.

At step 704, the substrate thickness is monitored using one or more lasers 340. Although FIG. 3 shows three lasers 340, the monitoring may be performed with a single movable laser, or any desired number of lasers.

At step 706, the thickness is monitored at each individual location when the dispenser dispenses etchant to that location. For example, if a plurality of lasers are used, then each laser monitors thickness of a respective portion of the substrate positioned at a given radius.

At step 708, the controller (not shown in FIG. 3) dynamically controls the amount of etching at each location by controlling the etching time and/or nozzle from which the etchant fluid is dispensed at each location. By selecting one of the nozzles, the controller can select a different concentration (if each nozzle dispenses the same type of etchant at a different concentration) or a different etchant (if each nozzle dispenses a different type of etchant). Alternatively, a first nozzle can be used to dispense a more highly concentrated etchant to perform a preliminary coarse etch at the given location, followed by a measurement (using the laser 340), and then followed by use of a second nozzle to dispense a less concentrated etchant to perform a finer etch at the same location. This provides the benefit of fine control (from the less concentrated etchant) without incurring prolonged etch times for the regions that require greater reduction in thickness.

The thinned wafer is singulated to provide ICs, which may be packaged in single layer or 3D-IC packages.

FIGS. 8A-8G show details of a method for formation of through vias before contact processing, by joining the wafers having through vias, and then thinning the joined wafers using one of the methods described above with reference to FIGS. 1-7. The through via may be a through silicon via (TSV) when silicon substrates are used, but the methods described herein are not limited to silicon substrates.

Figure 8A:
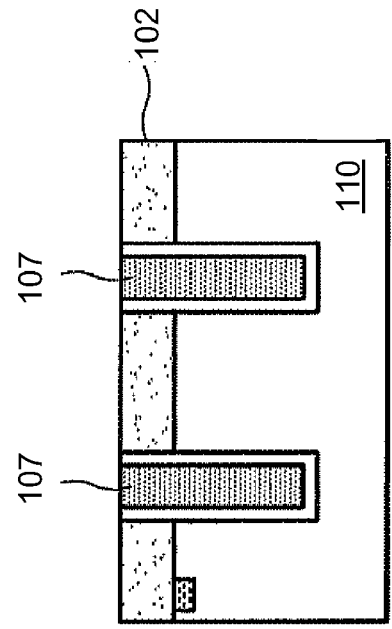
FIGS. 8A-8G show details of an exemplary method for joining wafers having at least one through via and thinning the wafers using one of the methods of FIGS. 4-7, for fabricating a 3D-IC.

FIG. 8A is a cross-sectional diagram of a portion of a substrate 110. Substrate 110 comprises a wafer, which is typically silicon (Si), but may also be made of gallium arsenide (GaAs), gallium arsenide-phosphide (GaAsP), indium phosphide (InP), gallium aluminum arsenic (GaAlAs), indium gallium phosphide (InGaP), and the like, and illustrates device 101 processed from substrate 110. In FIG. 8A, insulating layer 102 is deposited on wafer 110. One example of such insulating material that may be used is phosphosilicate glass (PSG). Etching is performed on wafer 110 to create via recesses 103. In order to prevent any conducting material from leaching into any active portions of the circuitry of wafer 110, liner oxide 105, such as silicon nitride, is deposited in a layer over wafer 110, including via recesses 103.

Figure 8B:
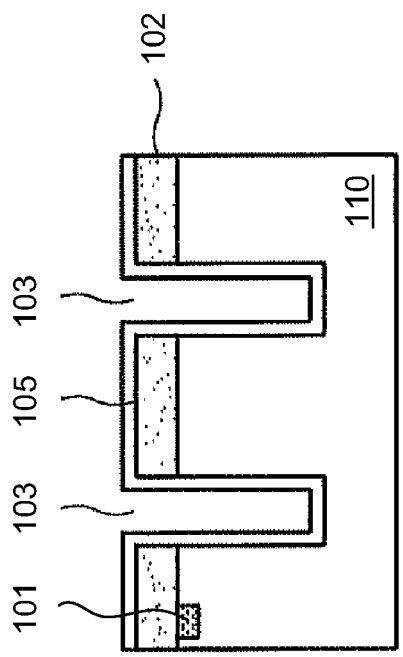

Referring now to FIG. 8B, a layer of conducting material, is deposited onto wafer 110. The conducting material may comprise various materials, such as copper, tungsten, aluminum, gold, silver, and the like. The conductive material fills via recesses 103. After removing the excess portions of the conductive material, either through etching, chemical mechanical polishing (CMP), or the like, wafer 110 now comprises vias 107 deposited in substrate 110 and insulating layer 102, as shown in FIG. 8B.

Figure 8C:
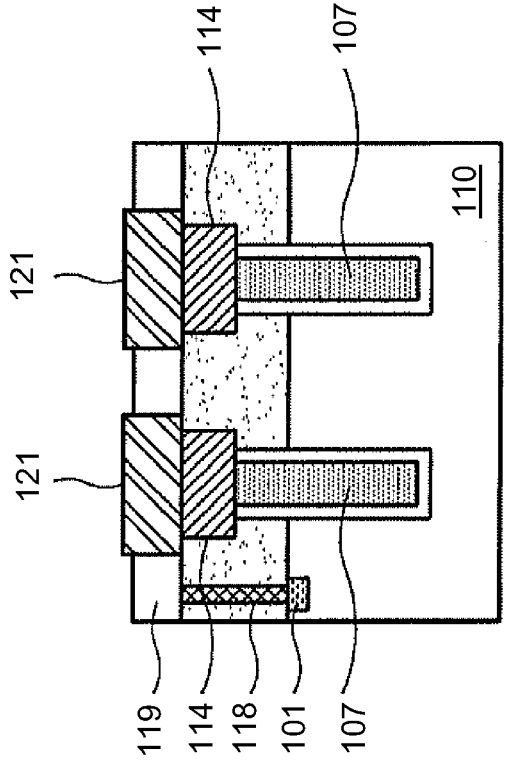

Additional insulating material is added on top of insulating layer 102 to form a combined insulating layer 110, resulting in vias 107 being enclosed within wafer 110. Another set of etching processes creates recesses in insulating layer 110, to expose the top surfaces of vias 107 and device 101, respectively through combined insulating layer 110. FIG. 8C shows wafer 110 in cross-section after conducting material is deposited onto wafer 110 filling in the recesses above vias 107 and device 101. Portions of this conducting material are removed through a process, such as CMP, to create contact pads 114, and connector 118, providing contact to device 101, as shown in FIG. 8C.

An interface is provided between contact pads 114 and vias 107. This interface may comprise a direct connection, as illustrated in FIG. 8C, but may also comprise an indirect connection, such as a redirection layer, conducting traces, or the like.

Figure 8D:
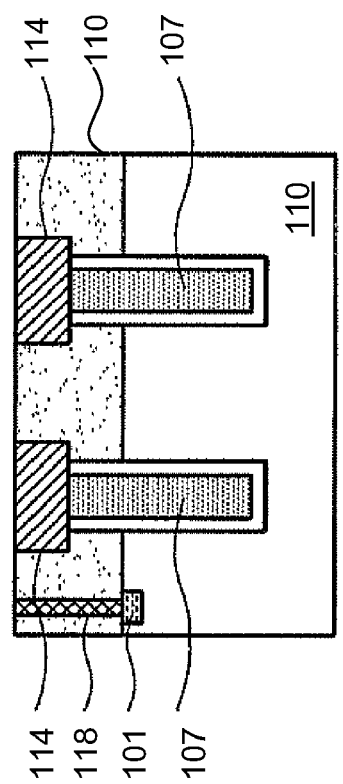

Bonding contacts 121, as shown in FIG. 8D, are formed by depositing intermetal dielectric (IMD) layer 119, which insulates device 101 from any other circuitry or devices in any wafers bonded to wafer 110. Recesses are etched into IMD layer 119 into which conducting material is deposited to form bonding contacts 121. The insulation or dielectric material making up IMD layer 119 is removed or etched to leave bonding contacts 121 slightly elevated above the top of IMD layer 119.

The bonding contacts 121 are not limited to the positions in relation to contact pads 114, as illustrated in 8D. However, a connection between bonding contacts 121 to contact pads 114 should exist in some manner, such as a redirection layer, conducting traces, or the like.

Figure 8F:
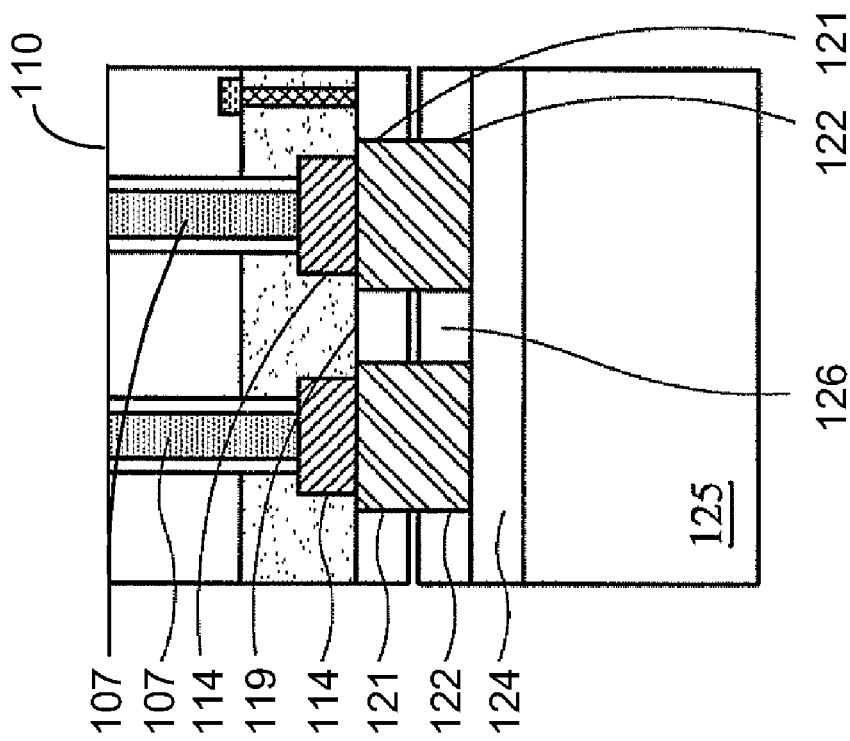
Figure 8E:
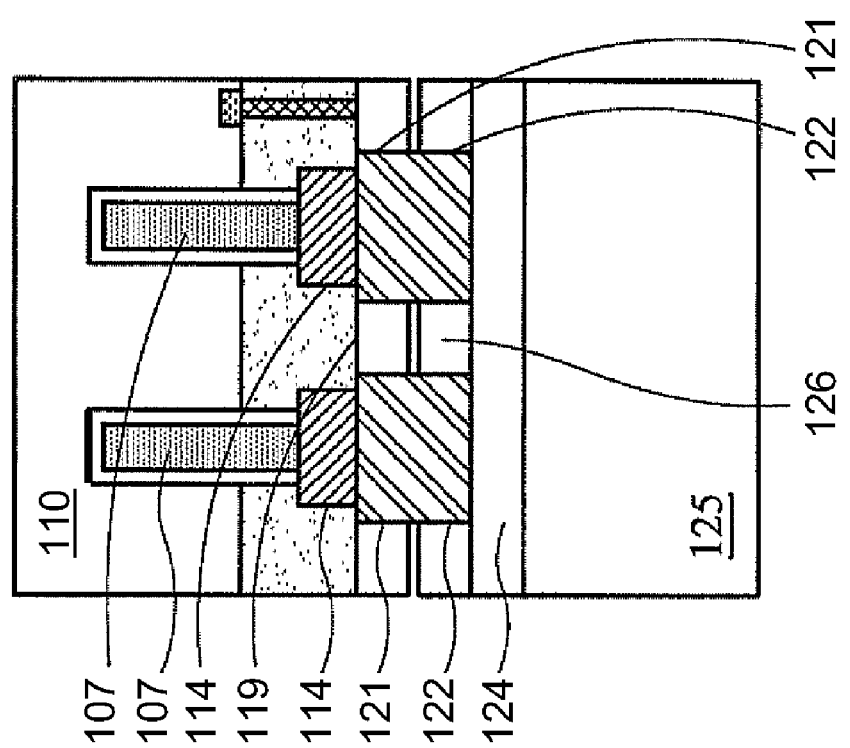

FIG. 8E is a cross-section of wafer 110 stacked and bonded to a second substrate 125. Substrate 125 comprises a carrier wafer, with an insulating layer 124, and IMD layer 126 thereon. Each of wafer 110 and 125 include an intermetal dielectric layer, IMDs 119 and 126 respectively, to limit interference between the various components on either wafer. Wafers 110 and 125 are bonded together at bonding pads 121 and 122 to form stacked wafer 110, 210 or 310 ready for the thinning process, as shown in FIG. 1, 2 or 3, respectively.

Any number of different devices, components, connectors, and the like may be integrated into wafers 110 and 125. The specific devices or lack of devices that may be illustrated herein are not intended to limit the embodiments in any way.

The etching methods described above with reference to FIGS. 1-7 are then used to thin the backside of the wafer 110, until the desired thickness is achieved, and the through vias are exposed, as shown in FIG. 8F. In one example, a wafer 110 may be thinned to a thickness of 30 μm. In another example, a wafer 110 may be thinned to a thickness of 20 μm. Because the wafer can be thinned uniformly by the process of FIGS. 1-7, a smaller final thickness is possible than can be achieved using CMP, and the through vias can be made with shorter height corresponding to the reduced thickness. For example, if the final wafer thickness is 50 µm, then the through via height is 50 µm, but a wafer thickness of 30 µm allows a through via height of 30 µm. By reducing the height of the through via, the cost of the conductive material (e.g., copper) filling the via is reduced, the process time to fill the through vias is reduced, and the aspect ratio of the through via is reduced.

Figure 8G:
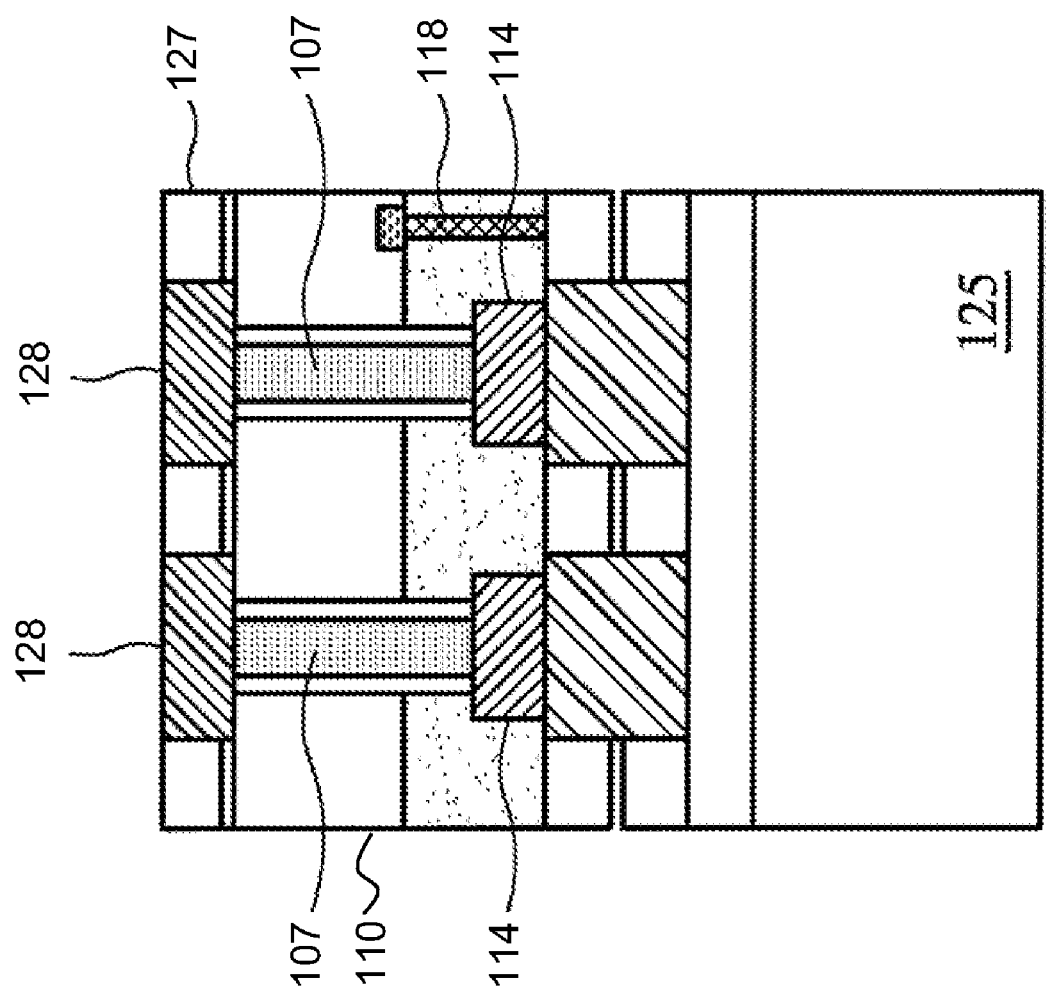

Following the thinning process described above with FIGS. 1-7, a metallization insulator layer 127 is deposited onto stacked wafer 110 of FIG. 8F, over vias 107. The metallization insulator layer 127 comprises layers of insulating material with a layer of liner material to prevent any metals deposited in the metallization process from leaching into stacked wafer 110. Recesses are then etched from metallization insulator layer. A metal, such as copper, tungsten, aluminum, or the like, is deposited over metallization insulation layer and then etched or removed. The metallization process results in the formation of contact pads 128 as shown in the configuration of FIG. 8G. Thus, vias 107 have been fully formed prior to the metallization and formation of the contact pads 128.

FIGS. 8A-8G provide one example of a fabrication method that benefits from the uniform thinning process of FIGS. 1-7, but does not limit the application of the thinning process, which can be used for single wafers, or stacked configurations having more than two wafers.

The exemplary methods may be used to improve the uniformity of wafer thinning (including both wafer-to-wafer uniformity and within-wafer uniformity), using in-situ wafer thickness measurements to enhance thinning uniformity control. One of ordinary skill in the art will appreciate that suitable apparatus for performing the method may be provided by modifications to current spinning process tools, or by newly developed tools.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for controlling substrate thickness, comprising:
   dispensing at least one etchant from at least one dispenser to a plurality of different locations on a surface of a spinning substrate to perform etching, the dispensing step including moving a single dispenser among the plurality of different locations;
   measuring a distance representative of a thickness of the spinning substrate at the plurality of locations, so that the distance representative of the thickness of the substrate is measured at each individual location while dispensing the etchant at that location; and
   controlling a respective amount of etching performed at each individual location, based on the respective measured distance representative of thickness at that location,
   wherein the moving step includes moving the dispenser at a first rate while the dispenser is dispensing etchant at a first location on the surface at which the substrate has a first thickness, and moving the dispenser at a second rate while the dispenser is dispensing etchant at a second location on the surface at which the substrate has a second thickness, wherein the first rate is less than the second rate, and the first thickness is greater than the second thickness.

2. The method of claim 1, wherein the amount of time during which etchant is dispensed to each location is controlled so that a standard deviation of the thickness is reduced to a predetermined value across the substrate.

3. The method of claim 1, wherein the amount of time during which etchant is dispensed to each location is controlled so that the thickness is substantially uniform across the substrate.

4. A method for controlling substrate thickness, comprising:
   dispensing at least one etchant from at least one dispenser to a plurality of different locations on a surface of a spinning substrate to perform etching;
   measuring a distance representative of a thickness of the spinning substrate at the plurality of locations, so that the distance representative of the thickness of the substrate is measured at each individual location while dispensing the etchant at that location; and
   controlling a respective amount of etching performed at each individual location, based on the respective measured distance representative of thickness at that location,
   wherein the dispensing step includes dispensing etchant for a first period of time at a first location on the surface at which the substrate has a first thickness, and dispensing etchant for a second period of time at a second location on the surface at which the substrate has a second thickness, wherein the first period of time is longer than the second period of time, and the first thickness is greater than the second thickness.

5. The method of claim 4, wherein the measuring step includes moving a single sensor among the plurality of different locations.

6. The method of claim 4, wherein the measuring step includes sequentially measuring the distance representative of the thickness of the substrate at each respective one of the plurality of locations using a respectively different sensor at each location.

7. The method of claim 4, wherein the dispensing step includes moving a single dispenser among the plurality of different locations.

8. The method of claim 4, wherein the substrate is a first semiconductor wafer, the method further comprising the step of:
   bonding the first semiconductor wafer to a second semiconductor wafer before the dispensing step.

9. The method of claim 7, wherein the dispenser moving step includes pivoting an arm about a pivot axis of the arm, the arm having the dispenser thereon, the dispenser being offset from the pivot axis of the arm.

10. The method of claim 9, wherein the pivoting step includes rotating the arm with a stepper motor.

11. A method for controlling substrate thickness, comprising:
    dispensing at least one etchant from at least one dispenser to a plurality of different locations on a surface of a spinning substrate to perform etching;
    measuring a distance representative of a thickness of the spinning substrate at the plurality of locations, so that the distance representative of the thickness of the substrate is measured at each individual location while dispensing the etchant at that location; and
    controlling a respective amount of etching performed at each individual location, based on the respective measured distance representative of thickness at that location, wherein the substrate is a first semiconductor wafer, the method further comprising the step of:

bonding the first semiconductor wafer to a second semiconductor wafer before the dispensing step, wherein:

the first and second semiconductor wafers each include a front face and at least one contact at the front face thereof, the surface of the first semiconductor wafer being a back face opposite the front face of the first semiconductor wafer;

the first semiconductor wafer includes a via having a conductive connection to the contact of the first semiconductor wafer;

the bonding step includes connecting the contacts of the first and second semiconductor wafers; and the dispensing step includes etching the back face of the first semiconductor wafer at least until the via is exposed at the back face.

12. The method of claim 11, further comprising forming contact pads above the vias after the dispensing step.

13. A method for controlling thickness of a semiconductor substrate having a front surface and a back surface, comprising the steps of:

spinning a semiconductor substrate in a spin processor;

moving a dispenser while dispensing an etchant from the dispenser to a plurality of different locations on the back surface of the spinning substrate;

measuring a distance representative of a thickness of the spinning substrate at the plurality of locations, so that the distance representative of the thickness of the substrate is measured at each individual location while dispensing the etchant at that location; and dynamically controlling a respective amount of time during which etchant is dispensed at each individual location, based on the respective measured distance representative of the thickness at that location, so that a standard deviation of the thickness is maintained at or below a predetermined value across the substrate, wherein the substrate is a semiconductor wafer, the method further comprising the step of:

bonding the first semiconductor wafer with a second semiconductor wafer before the dispensing step, and wherein:

the second semiconductor wafer includes a front surface, the first semiconductor wafer includes at least one via having a conductive connection to a contact at the front surface thereof, and the second semiconductor wafer includes at least one contact;

the bonding step includes connecting the contacts of the first and second semiconductor wafers; and the dispensing step includes etching the back surface of the first semiconductor wafer until the via is exposed at the back surface.

* * * * *